US007061768B2

(12) United States Patent
Lee et al.

(10) Patent No.: US 7,061,768 B2
(45) Date of Patent: Jun. 13, 2006

(54) OPEN SOCKET

(75) Inventors: Dong-Chun Lee, Cheonan-si (KR); Byung-Man Kim, Cheonan-si (KR); Kwang-Su Yu, Cheonan-si (KR); Dong-Woo Shin, Cheonan-si (KR); Young-Soo Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/868,976

(22) Filed: Jun. 17, 2004

(65) Prior Publication Data

US 2005/0118878 A1 Jun. 2, 2005

(30) Foreign Application Priority Data

Nov. 28, 2003 (KR) ...................... 10-2003-0085818

(51) Int. Cl.
*H05K 5/03* (2006.01)

(52) U.S. Cl. ...................... 361/727; 439/261; 324/754; 174/67

(58) Field of Classification Search ........ 361/679–683, 361/724–727; 439/260, 261; 385/58; 324/754; 174/67
See application file for complete search history.

(56) References Cited

U.S. PATENT DOCUMENTS

| | | | | |
|---|---|---|---|---|
| 6,287,016 | B1 * | 9/2001 | Weigel | 385/58 |
| 6,824,410 | B1 * | 11/2004 | Co et al. | 439/260 |
| 2001/0005142 | A1 * | 6/2001 | Lee | 324/754 |
| 2004/0129443 | A1 * | 7/2004 | He et al. | 174/67 |

* cited by examiner

*Primary Examiner*—Hung Van Duong
(74) *Attorney, Agent, or Firm*—Harness, Dickey & Pierce, P.L.C.

(57) ABSTRACT

An open socket, into which a module can be inserted, may include: a body into which the module is insertable; a pin to contact an electrical connection member of the inserted module, the pin serving as at least a part of an electrical signal path to/from the module upon insertion thereof; an elastic biasing member to exert an elastic biasing force to cause the pin to contact the module; and at least one lower support to limit insertion depth as being a depth at which a lower portion of the inserted module comes to rest upon the at least one lower support; the body and the at least one lower support being constructed and arranged to provide a gap adjacent the at least one support, which leaves an area of the socket underlying the lower portion of the inserted module open to the outside.

8 Claims, 4 Drawing Sheets

OPEN SOCKET

CROSS REFERENCE TO RELATED APPLICATION

This application claims the priority of Korean Patent Application No. 2003-85818, filed on Nov. 28, 2003, in the Korean Intellectual Property Office, the disclosure of which is hereby incorporated by reference in its entirety.

BACKGROUND OF THE INVENTION

FIG. 1 is a perspective view of a conventional socket 100 and a module 210 inserted into the socket, according to the Background Art.

It can be seen from FIG. 1 that the module 210 should be inserted into the fixed socket 100 to test electrical characteristics of the module 210.

FIG. 2 is a transverse-sectional view of the socket 100 of FIG. 1.

Referring to FIG. 2, the socket 100 includes a body 220, a synthetic rubber biasing member 230, a pin 240, and a lower support 200.

The body 220 retains the external shape of the socket 100 and supports the inserted module 210. After the module 210 is inserted into the socket 100, the pin 240 contacts an electrical connection member of the module 210 and serves as an electrical signal path between the module 210 and the socket 100. The biasing member 230 exerts an elastic force on the pin 240 to cause the pin 240 to tightly contact the module 210. The lower support 200 adjusts the depth of the inserted module 210 with respect to the socket 100 and closes up the area of the socket below the lower portion of the inserted module 210.

Since the area of the socket below the lower portion of the inserted module 210 is closed up, the socket 100 is defined as a closed type socket. Most sockets are configured such that a module is vertically inserted into the sockets. As a result, if foreign substances enter the socket 100 and accumulate between the lower support 200 of the socket 100 and the module 210, it is not easy to recognize and remove such foreign substances.

Module manufacturers need to test the electrical characteristics of manufactured modules. For such tests, it is common practice to repeatedly insert manufactured modules into and pull them out from the socket.

For several reasons, foreign substances that enter the socket have a negative influence upon the electrical connection members of the socket and module, potentially resulting in an electrical contact failure. As a result, test results can become unreliable and users may complain about modules if the modules with foreign substances are released into the market. In particular, if the modules include rigid foreign substances, the modules and sockets into which they are inserted may get broken, resulting in defects in products or productivity deterioration.

SUMMARY OF THE INVENTION

At least one embodiment of the present invention provides an open socket in which the lower portion of the open socket is entirely or partially opened, thereby minimizing an influence on a module and the open socket of foreign substances that enter the open socket.

At least one embodiment of the present invention provides an open socket in which an electrical connection member of the open socket that contacts an electrical connection member of a module has a continuously convex insertion profile to reduce, if not minimize, a contact area therebetween, which reduces the possibility of foreign substances being generated when the electrical connection members of the open socket and the module contact each other.

At least one embodiment of the present invention provides an open socket into which a module is inserted. Such an open socket may include: a body into which the module is insertable; a pin to contact an electrical connection member of the inserted module, the pin serving as at least a part of an electrical signal path to/from the module upon insertion thereof; an elastic biasing member to exert an elastic biasing force to cause the pin to contact the module; and at least one lower support to limit insertion depth as being a depth at which a lower portion of the inserted module comes to rest upon the at least one lower support; the body and the at least one lower support being constructed and arranged to provide a gap adjacent the at least one support, which leaves an area of the socket underlying the lower portion of the inserted module open to the outside.

Additional features and advantages of the invention will be more fully apparent from the following detailed description of example embodiments, the accompanying drawings and the associated claims.

BRIEF DESCRIPTION OF THE DRAWINGS

The above and other aspects and advantages of the present invention will become more apparent by describing in detail example embodiments thereof with reference to the attached drawings in which.

DETAILED DESCRIPTION OF THE INVENTION

Figure 1:
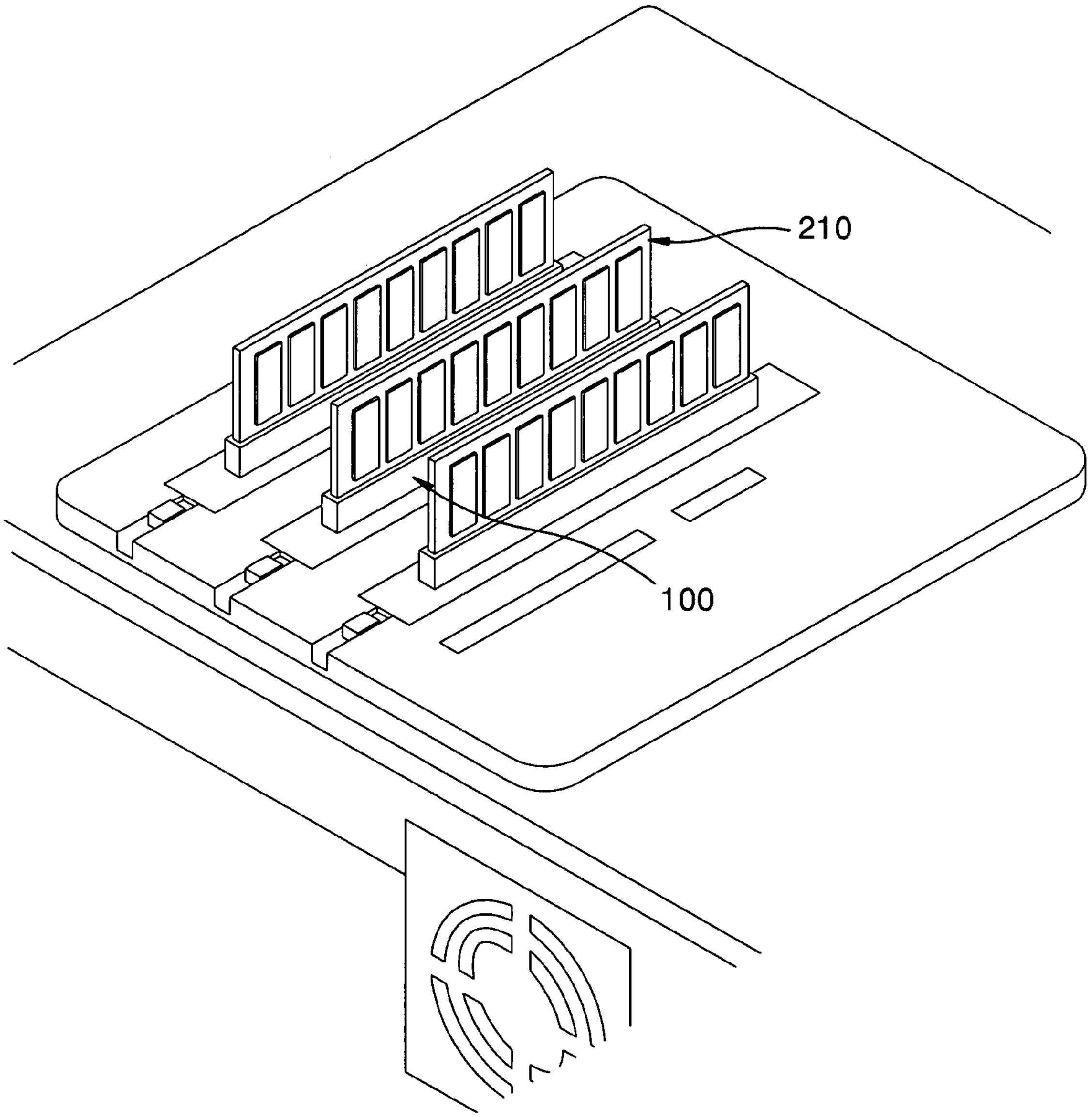
FIG. 1 (BACKGROUND ART)
FIG. 1 is a perspective view of a socket and a module inserted into the socket, according to the Background Art.
Figure 2:
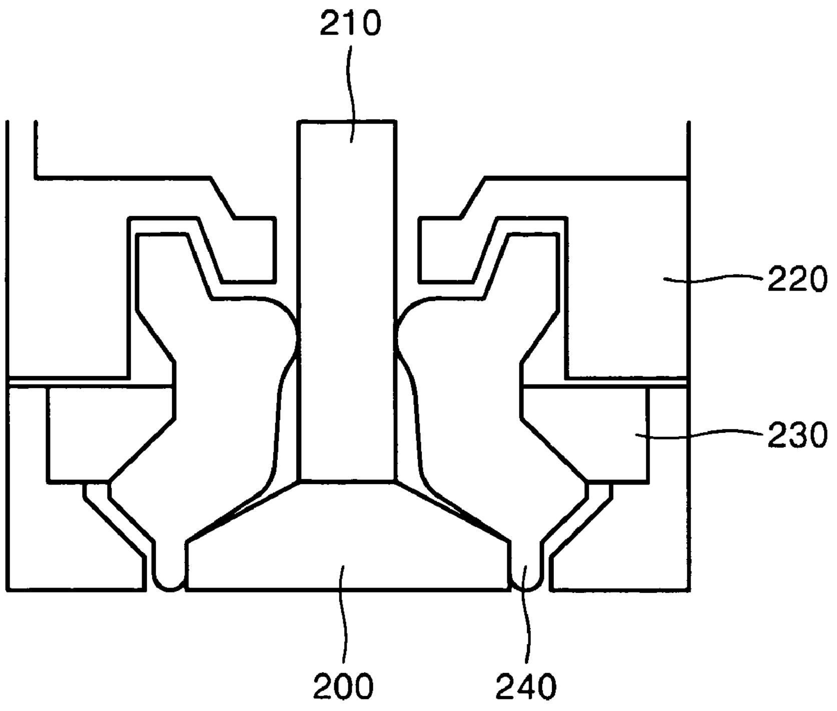
FIG. 2 (BACKGROUND ART)
FIG. 2 is a transverse sectional view of the socket of FIG. 1.

The present invention will now be described more fully with reference to the accompanying drawings, in which embodiments of the invention are shown. Throughout the drawings, like reference numerals are used to refer to like elements.

In developing the present invention, the following observation and inference regarding the Background Art were made. During the repeated insertion and withdrawal of a module 210 from the socket 100 associated with testing, there is a significant risk of foreign substances accumulating in the socket 100, the occurrence of which is a problem, e.g., because of the difficulty of their removal and/or the skewing of test results due to the foreign substances causing misalignment or incomplete insertion. Also, an electrical connection member, e.g., a pin, of the socket is strongly biased into contact with the electric connection member of the module due to the biasing member. Therefore, as the electrical connection members of the socket and module get larger, the forces exerted against the inserted module can proportionally increase such that the repetitive processes cause more unwanted negative influences such as generation of foreign substances due to friction.

Figure 3:
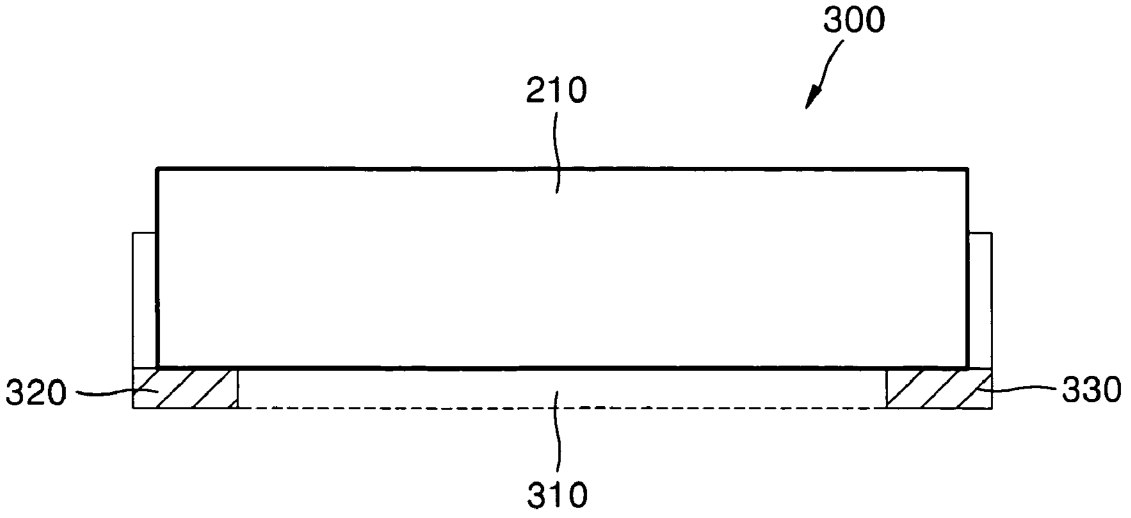
FIG. 3 is a longitudinal sectional view of an open socket 300 according to at least a first and a second embodiment of the present invention.

FIG. 3 is a longitudinal sectional view of an open socket 300 according to at least a first embodiment of the present invention.

Referring to FIG. 3, the open socket 300 is different from the Background Art socket 100 of FIG. 1, e.g., by including: two lower supports 320 and 330 instead of one larger support according to the Background Art. Lower supports 320 and 330 support the ends of the lower portion of a module 210 when it is inserted into the open socket 300. A center opening (or gap) 310 (indicated by a dotted line) corresponds to what otherwise would have been a solid center section of the larger Background Art lower support. The gap 300 leaves a center region of the lower portion of the module 210 unsupported and also provides a passage through which foreign substances can exit the open socket 300.

Figure 4:
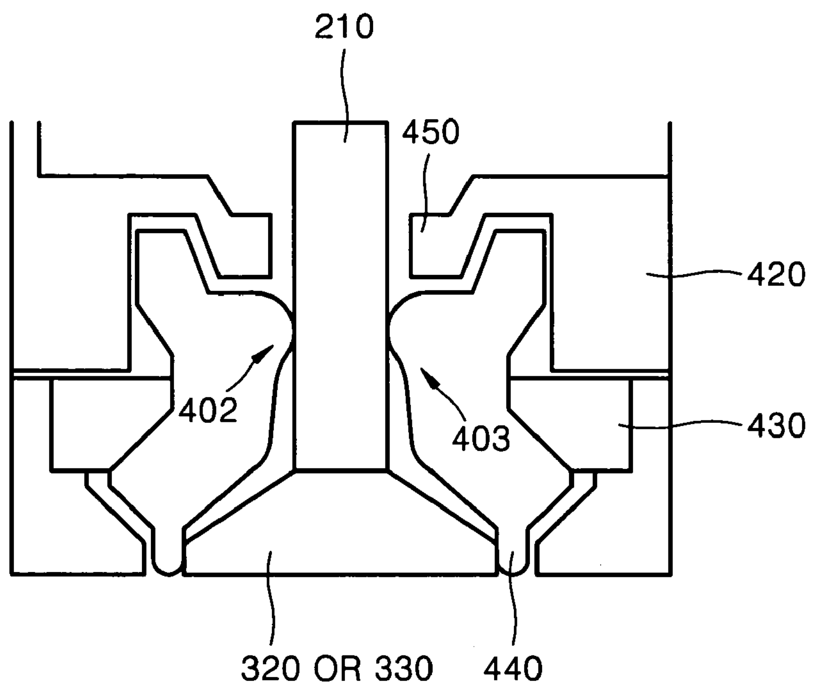
FIG. 4 is a transverse sectional view of edges of the open socket 300 of FIG. 3.

FIG. 4 is a transverse sectional view of the edges 320 and 330 of the open socket 300 of FIG. 3.

Figure 5:
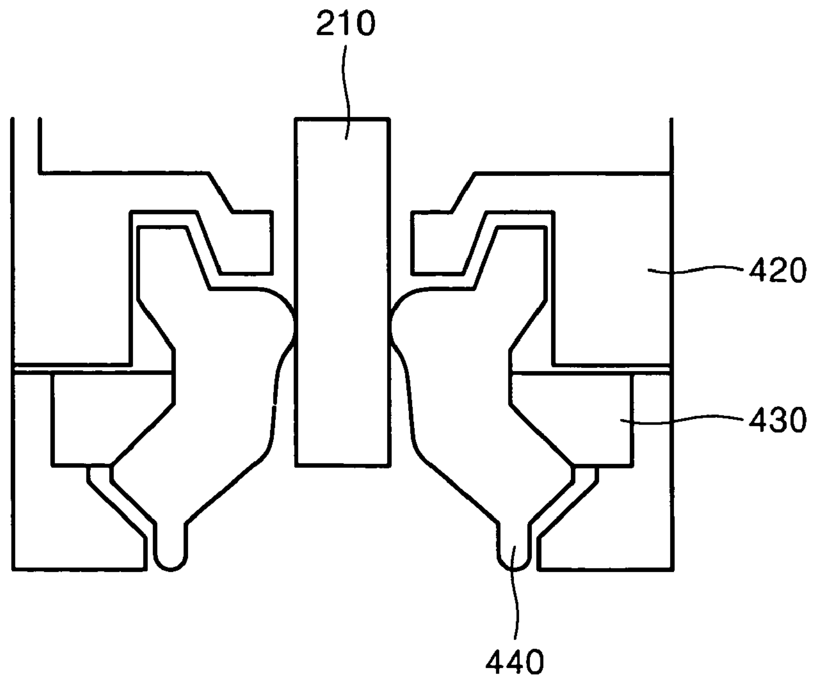
FIG. 5 is a transverse sectional view of a center portion of the open socket 300 of FIG. 3.

FIG. 5 is a transverse sectional view of the center portion 310 of the open socket 300 of FIG. 3.

Referring to FIGS. 4 and 5, the open socket 300 includes a body 420, an elastic (e.g., elastomeric such as synthetic rubber) biasing member 430, and at least one pin 440 having an electrical connection member 402. The body 420 retains an external shape of the open socket 300 and supports the inserted module 210. The body 420 rests on and is supported by lower supports 320 and 330. After the module 210 is inserted into the open socket 300, the pin 440 contacts an electrical connection member of the module 210 and serves as at least a portion of an electrical signal path to/from the module 210. Compression of the biasing member 430 causes it to exert an elastic biasing force on the pin 440 which then causes the pin 440 to press against the module 210 sufficiently tightly to obtain a good electrical connection.

The open socket 300 is similar to the Background Art socket 100 in that it includes the body 420, the biasing member 430, and the pin 440. However, in the open socket 300, the lower supports 320 and 330 exist but what otherwise would have been the center portion of a larger unitary lower support is not provided. As a result, foreign substances that enter the open socket 300 are naturally expelled from the open socket 300 by gravity or by using, e.g., a vacuum cleaner, compressed air; etc.

An open socket 300 according to at least a second embodiment of the present invention is indicated in FIG. 3 via the stippled portions of the lower supports 320 and 330, which would not be provided such that no part of the supports 320 and 330 would be located under a module that is inserted into the open socket 300. In this embodiment, another structure should be included to support the module. Alternatively, only one of the stippled portions, e.g., that of lower support 330 is omitted such that only lower support 320 limits the depth of insertion of the module 210.

Figure 6:
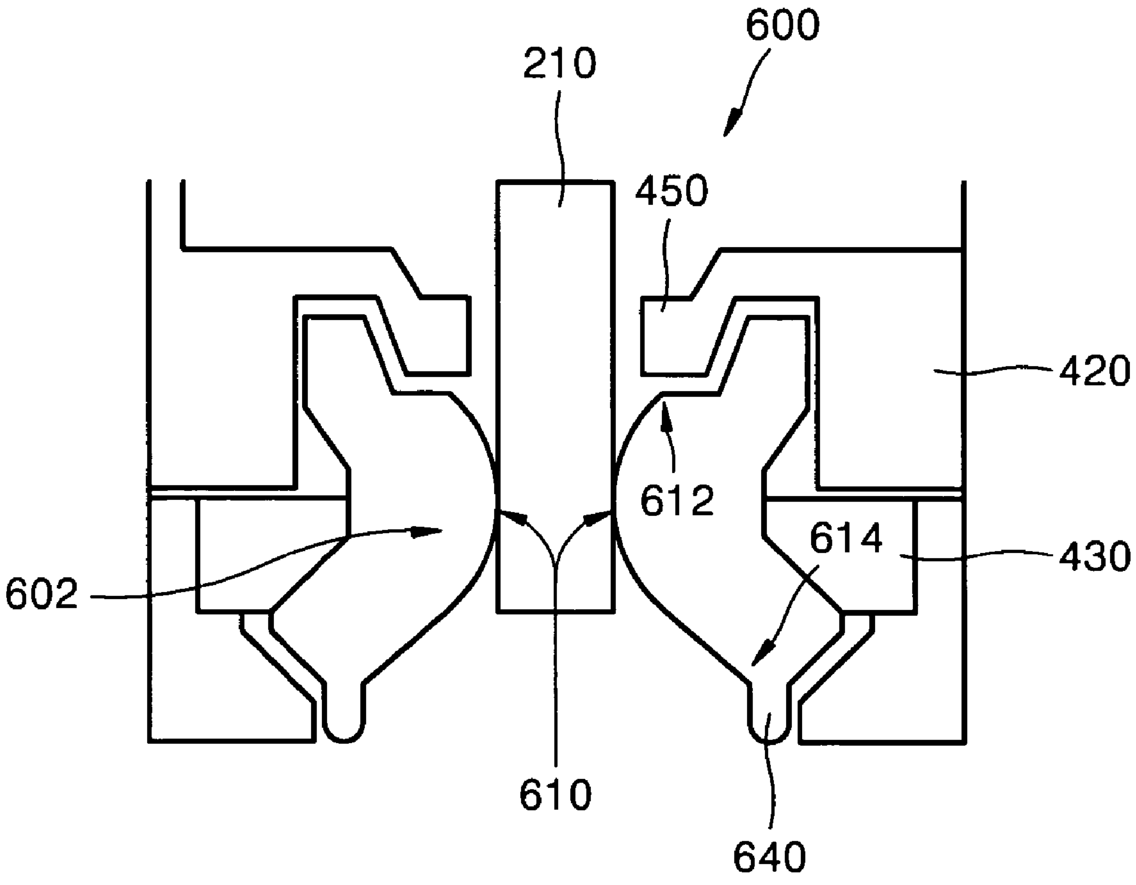
FIG. 6 is a transverse sectional view of an open socket 300 according to at least a second embodiment of the present invention.

FIG. 6 is a transverse sectional view of an open socket 600 according to at least a third embodiment of the present invention.

Referring to FIG. 6, an open socket 600 includes a pin 600 whose electrical connection member 602 has an arcuate, e.g., round, shape to provide a different (e.g., relative to the electrical connection member 402) and reduced contact area 610 between the electrical connection member 602 of the open socket 600 and an electrical connection member 602 of the module 600, thereby reducing a possibility of generation of foreign substances in spite of repetitive contact between the electrical connection member 600 and the electrical connection member 610. In addition, a portion of the electrical connection member 602 that makes contact with the module 210 is located relatively farther from a flange 450 then the corresponding contact portion of the electrical connection member 402.

A surface of the electrical connection member 602 between an upper point 612 and a lower part 614 can be described as an insertion profile. The electrical connection member 602 has a continuously convex insertion profile whereas, e.g., a corresponding portion of the electrical connection member 402 is not continuously convex (there being a relative concavity 403).

As described above, a least one embodiment of the open socket 300 according to the present invention can reduce accumulation of foreign substances that enter the open socket 300 from in the lower portion of the open socket 300 and can cause the foreign substances to be naturally ejected from the open socket 300. Thus, it is possible to avoid problems such as breakage of a socket or a module and contact failure and improve productivity.

Also, an electrical connection member of such an open socket 300 can according to at least one embodiment of the present invention can be given a round shape to reduce a contact area, thereby reducing a possibility of generating foreign substances when the electrical connection members of the open socket and the module contact each other.

While the present invention has been particularly shown and described with reference to example embodiments thereof, it will be understood by those of ordinary skill in the art that various changes in form and details may be made therein without departing from the spirit and scope of the invention.

What is claimed is:

1. An open socket into which a module can be inserted, the open socket comprising:
- a body into which the module is insertable;
- a pin to contact an electrical connection member of the inserted module, the pin serving as at least a part of an electrical signal path to/from the module upon insertion thereof;
- an elastic biasing member to exert an elastic biasing force to cause the pin to contact the module; and
- at least one lower support to limit insertion depth as being a depth at which a lower portion of the inserted module comes to rest upon the at least one lower support;
- the body and the at least one lower support being constructed and arranged to provide a gap adjacent the at least one support, which leaves an area of the socket underlying the lower portion of the inserted module open to the outside.

2. The open socket of claim 1, further comprising two lower supports located so as to limit the insertion depth.

3. The open socket of claim 1, wherein the elastic biasing member is rubber.

4. The open socket of claim 1, wherein an electrical connection member of the pin has a continuously convex insertion profile.

5. An open socket into which a module can be inserted, the open socket comprising:
- a body into which the module is insertable;
- a pin to contact an electrical connection member of the inserted module, the pin serving as at least a part of an electrical signal path to/from the module upon insertion thereof;

an elastic biasing member to exert an elastic biasing force to cause the pin to contact the module; and a lower support on which the body partially rests, no portion of the lower support extending underneath the lower portion of the inserted module.

6. The open socket of claim 5, wherein the elastic biasing member is rubber.

7. The open socket of claim 5, wherein an electrical connection member of the pin has a continuously convex insertion profile.

8. An open socket into which a module can be inserted, the open socket comprising:

a body into which the module is insertable;

a pin having a first electrical connection member to contact a corresponding second electrical connection member of the inserted module, the first electrical connection member having a continuously convex insertion profile;

an elastic biasing member to exert an elastic biasing force to cause the pin to contact the module; and at least one lower support to limit insertion depth as being a depth at which a lower portion of the inserted module comes to rest upon the at least one lower support.

* * * * *